(12) United States Patent
Suemori

(10) Patent No.: US 9,704,770 B2
(45) Date of Patent: Jul. 11, 2017

(54) ELECTRONIC COMPONENT MODULE

(71) Applicant: Murata Manufacturing Co., Ltd., Nagaokakyo-shi, Kyoto-fu (JP)

(72) Inventor: Yoshiharu Suemori, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/702,882

(22) Filed: May 4, 2015

(65) Prior Publication Data

US 2015/0334846 A1 Nov. 19, 2015

(30) Foreign Application Priority Data

May 14, 2014 (JP) ................. 2014-100255

(51) Int. Cl.
*H05K 1/18* (2006.01)
*H05K 1/16* (2006.01)
*H01L 23/29* (2006.01)
*H01L 23/31* (2006.01)
*H05K 1/11* (2006.01)

(52) U.S. Cl.
CPC ............ *H01L 23/3135* (2013.01); *H05K 1/11* (2013.01); *H05K 1/186* (2013.01); *H01L 2224/16225* (2013.01); *H01L 2924/181* (2013.01); *H05K 2201/10015* (2013.01)

(58) Field of Classification Search
CPC ... H05K 2201/0195; H05K 2203/1316; H05K 2203/1322; H05K 5/065; H01L 23/31
USPC ........................... 361/762, 765; 257/789, 790
See application file for complete search history.

(56) References Cited

U.S. PATENT DOCUMENTS 4,974,057 A * 11/1990 Tazima ............... H01L 23/3135
257/693
5,379,186 A * 1/1995 Gold .................. H01L 23/3121
257/790

(Continued)

FOREIGN PATENT DOCUMENTS

JP 2005-302835 A 10/2005
JP 2006-245989 A 9/2006

OTHER PUBLICATIONS

Asada (JP 04-092459) Original Japanese copy.*

(Continued)

*Primary Examiner* — Chau N Nguyen
*Assistant Examiner* — Roshn Varghese
(74) *Attorney, Agent, or Firm* — Keating & Bennett, LLP

(57) ABSTRACT

An electronic component module includes a substrate, an electronic component mounted on the substrate, and a resin sealing portion that seals the electronic component and covers a principal surface of the substrate. The resin sealing portion includes a film-shaped resin layer that covers upper and side surfaces of the electronic component and the principal surface of the substrate, and an embedding resin layer that covers the film-shaped resin layer. The embedding resin layer has a smaller coefficient of linear expansion than that of the film-shaped resin layer. A portion of the film-shaped resin layer covering the side surfaces has a smaller thickness than either of a thickness of a portion of the film-shaped resin layer covering the upper surface and a thickness of a portion of the film-shaped resin layer covering the principal surface.

9 Claims, 7 Drawing Sheets

(56) References Cited

U.S. PATENT DOCUMENTS

| | | | | |
|---|---|---|---|---|
| 5,461,545 | A * | 10/1995 | Leroy | H05K 3/284 |
| | | | | 257/787 |
| 6,548,912 | B1 * | 4/2003 | Graff | H01L 23/3192 |
| | | | | 257/758 |
| 7,723,162 | B2 * | 5/2010 | Anderson | H01L 23/3135 |
| | | | | 257/E21.499 |
| 2004/0150118 | A1 * | 8/2004 | Honda | H01L 21/563 |
| | | | | 257/778 |
| 2007/0020814 | A1 * | 1/2007 | Hembree | H01L 21/563 |
| | | | | 257/E21.503 |
| 2008/0272858 | A1 | 11/2008 | Furihata et al. | |
| 2010/0002401 | A1 * | 1/2010 | Tsujimura | H05K 3/288 |
| | | | | 361/748 |

OTHER PUBLICATIONS

Asada (JP 04-092459) English Machine Translation copy.*
Definition of "portion" from www.thefreedictionary.com provided with Office Action, Nov. 23, 2016.*

* cited by examiner

ELECTRONIC COMPONENT MODULE

BACKGROUND OF THE INVENTION

1. Field of the Invention

The present invention relates to an electronic component module in which an electronic component mounted on a substrate is sealed by a resin sealing portion.

2. Description of the Related Art

There has been known an electronic component module in which an electronic component is provided on a substrate and sealed by providing a resin sealing portion on the substrate with the electronic component mounted.

For example, Japanese Unexamined Patent Application Publication No. 2005-302835 discloses a semiconductor device configured such that a solder joint portion provided between an electronic component a semiconductor element or a passive component) and a substrate is surrounded by a hollow portion to restrict solder flashing that occurs during reflowing, a resin film is bonded in a close contact manner on the entire surface of the substrate with the electronic component mounted and is hardened to form a film-shaped resin layer to improve sealing properties of the hollow portion and the electronic component, and then liquid resin is applied to cover the film-shaped resin layer and is hardened to form an embedding resin layer. Hence, the electronic component on the substrate is covered with a resin sealing portion having a two-layer structure including the film-shaped resin layer and the embedding resin layer.

Also, Japanese Unexamined Patent Application Publication No. 2006-245989 discloses a surface acoustic wave device including a resin sealing portion having a three-layer structure so that a surface acoustic wave element serving as an electronic component on a substrate is sealed. The surface acoustic wave device disclosed in Japanese Unexamined Patent Application Publication No. 2006-245989 is configured such that two layers included in the resin sealing portion having the three-layer structure located at a side near the surface acoustic wave element are formed of film-shaped resin layers, and the residual one layer is formed of an embedding resin layer, to improve the thermal shock resistance. Further, the physical properties, such as elastic coefficients and coefficients of linear expansion, of the film-shaped resin layers and the embedding resin layer satisfy predetermined conditions.

However, typically for this kind of electronic component module, it is not sufficient if only one of the sealing properties and the thermal shock resistance is satisfied, and it is important to ensure both the sealing properties and the thermal shock resistance.

To improve the sealing properties, to cause the resin film to be the above-described film-shaped resin layer to closely contact the electronic component and the substrate, the resin film may be preferably formed of a relatively soft member having high extensibility. However, in this case, the elastic coefficient of the resin film may generally become low. It may be difficult to obtain sufficient joining reliability in view of thermal shock resistance.

SUMMARY OF THE INVENTION

Accordingly, preferred embodiments of the present invention provide an electronic component module that ensures both sealing properties and thermal shock resistance and hence provides high reliability.

An electronic component module according to a preferred embodiment of the present invention includes an electronic component; a substrate including a principal surface on which the electronic component is mounted; and a resin sealing portion that seals the electronic component and covers the principal surface of the substrate. The resin sealing portion includes a film-shaped resin layer, the electronic component including a lower surface facing the substrate, an upper surface located at a side opposite to the lower surface, and side surfaces, the film-shaped resin layer covering the upper surface and the side surfaces and covering the principal surface of the substrate; and an embedding resin layer, the film-shaped resin layer including a front surface located at a side opposite to the substrate, the embedding resin layer covering the front surface. The embedding resin layer has a smaller coefficient of linear expansion than a coefficient of linear expansion of the film-shaped resin layer. A portion of the film-shaped resin layer covering the side surfaces of the electronic component has a smaller thickness than any of a thickness of a portion of the film-shaped resin layer covering the upper surface of the electronic component and a thickness of a portion of the film-shaped resin layer covering the principal surface of the substrate.

Preferably, the above-described electronic component module may further include a protecting resin layer located at a side opposite to the substrate when viewed from the embedding resin layer. In this case, the protecting resin layer may have a smaller thickness than a minimum thickness of the embedding resin layer in a direction perpendicular or substantially perpendicular to the principal surface of the substrate.

Preferably in the above-described electronic component module, a hollow portion may be provided between the principal surface of the substrate and the lower surface of the electronic component, the hollow portion being surrounded by the film-shaped resin layer. In this case, a joint portion between the substrate and the electronic component may be located in the hollow portion.

Preferably in the above-described electronic component module, the electronic component may be provided with an electrode and the substrate may be provided with a land, and the electrode and the land may be joined through solder.

Preferably in the above-described electronic component module, the film-shaped resin layer may include a multilayer body including a plurality of resin films. In this case, the embedding resin layer may have a smaller coefficient of linear expansion than a coefficient of linear expansion of any layer of the film-shaped resin layer including the multilayer body. Also, a portion of the film-shaped resin layer including the multilayer body covering the side surfaces of the electronic component may have a smaller total thickness than any of a total thickness of a portion of the film-shaped resin layer including the multilayer body covering the upper surface of the electronic component and a total thickness of a portion of the film-shaped resin layer including the multilayer body covering the principal surface of the substrate.

With the preferred embodiments of the present invention, both the sealing properties and the thermal shock resistance are ensured, and hence an electronic component module with high reliability is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention are described in detail below with reference to the drawings. In the preferred embodiments described below, the same reference sign is applied to the same or common portion, and its repetitive description is omitted.

First Preferred Embodiment

Figure 1:
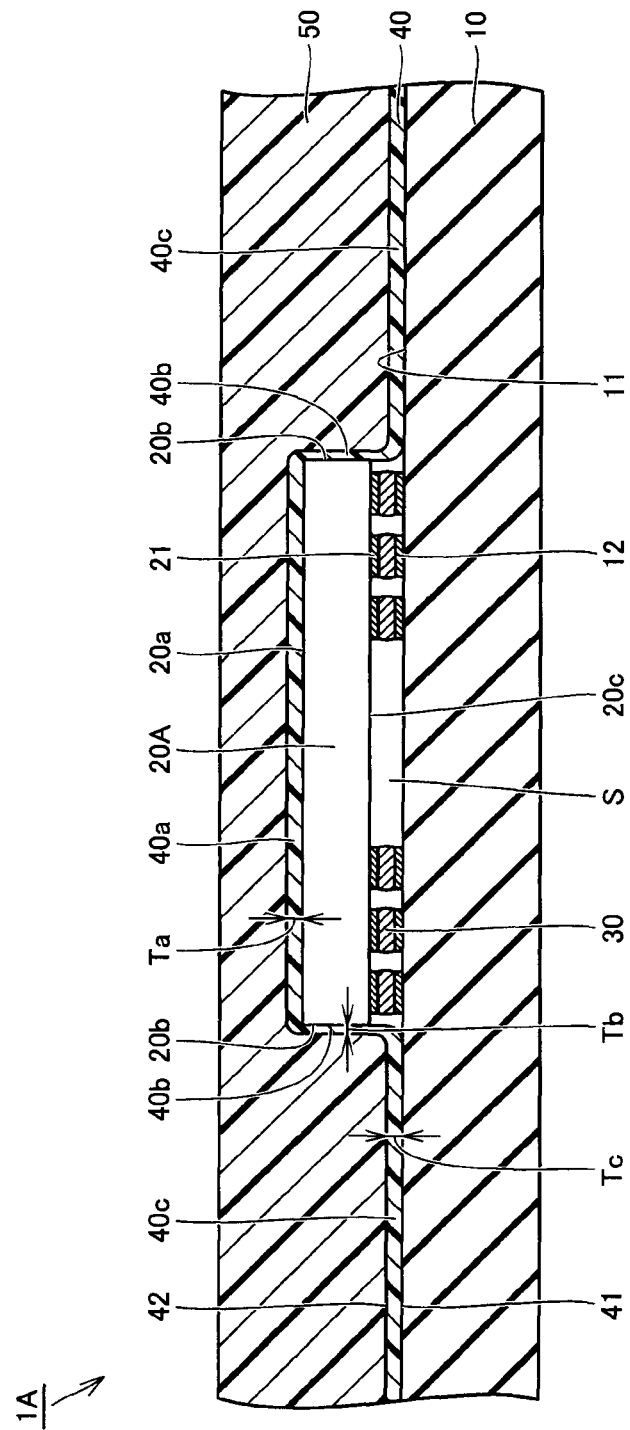
FIG. 1 is a schematic cross-sectional view of an electronic component module according to a first preferred embodiment of the present invention.

FIG. 1 is a schematic cross-sectional view of an electronic component module according to a first preferred embodiment of the present invention. An electronic component module 1A according to this preferred embodiment is described below with reference to FIG. 1.

As shown in FIG. 1, the electronic component module 1A according to this preferred embodiment preferably includes a substrate 10, an electronic component 20A, a joint material 30, and a film-shaped resin layer 40 and an embedding resin layer 50 as a resin sealing portion. The electronic component module 1A according to this preferred embodiment includes a semiconductor element as the electronic component 20A, for example.

The substrate 10 includes a principal surface 11 on which the electronic component 20A is mounted, and a land 12 is provided on the principal surface 11. The land 12 is connected with a wiring pattern (not shown) provided on the substrate 10. As the substrate 10, any of various kinds may be used as long as an electronic component is able to be mounted thereon. For example, a printed wiring board, a ceramic substrate, a resin film substrate, or other substrate can be used.

The electronic component 20A includes an upper surface 20a, side surfaces 20b, and a lower surface 20c. The electronic component 20A is mounted on the principal surface 11 of the substrate 10 while the lower surface 20c among these surfaces faces the substrate 10. The upper surface 20a is at a side opposite to the lower surface 20c. The upper surface 20a and the lower surface 20c are opposed to each other. The side surfaces 20b connect the upper surface 20a with the lower surface 20c. An electrode 21 is provided on the lower surface 20c of the electronic component 20A. The electrode 21 and the above-described land 12 are joined by the joint material 30 while the electrode 21 and the land 12 are opposed to each other. Accordingly, the electronic component 20A is electrically connected with the substrate 10.

As the joint material 30, any of various kinds used to mount an electronic component may be used. For example, solder or any of various kinds of brazing alloys similar to the solder may be used. When solder is used as the joint material 30, it is advantageous because a rework is capable of being relatively easily performed.

Also, in this preferred embodiment, the example of using the semiconductor element as the electronic component 20A is described; however, the electronic component that is mounted on the substrate 10 may be any other electronic element, such as a capacitor element, an inductor element, a resistive element, or a piezoelectric element. Further, a plurality of electronic components of the same kind or different kinds may be mounted on the substrate 10.

The resin sealing portion including the film-shaped resin layer 40 and the embedding resin layer 50 covers the upper surface 20a and the side surfaces 20b of the electronic component 20A, and the principal surface 11 of the substrate 10. The film-shaped resin layer 40 is interposed between the substrate 10 and the electronic component 20A, and the embedding resin layer 50.

To be more specific, a back surface 41 of the film-shaped resin layer 40 located at a side near the substrate 10 contacts the upper surface 20a and the side surfaces 20b of the electronic component 20A and a portion of the principal surface 11 of the substrate 10 excluding a region where the electronic component 20A is mounted, and is fixed to these surfaces. Accordingly, the substrate 10 and the electronic component 20A are covered with the film-shaped resin layer 40.

The film-shaped resin layer 40 extends along the outside shape of a protruding and recessed shape of the electronic component 20A and the substrate 10 after the electronic component 20A is mounted on the substrate 10. Accordingly, the film-shaped resin layer 40 includes an upper-surface cover portion 40a that is a portion covering the upper surface 20a of the electronic component 20A, a side-surface cover portions 40b that is a portion covering the side surfaces 20b of the electronic component 20A, and a substrate cover portion 40c that is a portion covering the principal surface 11 of the substrate 10.

The embedding resin layer 50 contacts a front surface 42 of the film-shaped resin layer 40 located at a side opposite to the back surface 41 located at a side near the substrate 10 and is fixed to the front surface 42. Accordingly, the film-shaped resin layer 40 is covered with the embedding resin layer 50.

The embedding resin layer 50 embeds a recessed portion and covers a protruding portion included in a protruding and recessed shape of the front surface of the film-shaped resin layer 40 caused by the protruding and recessed shape of the electronic component 20A and substrate 10.

The materials of the film-shaped resin layer 40 and the embedding resin layer 50 are not particularly limited as long as the materials are used for sealing an electronic component. If the electronic component module 1A according to this preferred embodiment is further mounted on a mother board etc. and used, for example, heat-resistant epoxy resin or liquid crystal polymer may be preferably used in view of reflowing performed during mounting. As described later, the physical properties, such as the elastic coefficients and coefficients of linear expansion, of the film-shaped resin layer 40 are adjusted to be different from the physical properties, such as the elastic coefficients and coefficients of linear expansion, of the embedding resin layer 50. The adjustment of the physical properties may be provided, for example, by changing the composition of a resin material to be used, the presence of a filler, the material and particle diameter of the filler, and the content of the filler. The thickness of the film-shaped resin layer 40 is relatively small. Hence, the film is easily broken. To prevent the breakage of the film, the film-shaped resin layer 40 with a low content of the filler may preferably easily extend. To be more specific, the filler content of the film-shaped resin layer 40 is lower than the filler content of the embedding resin layer 50.

Hence, in the electronic component module 1A according to this preferred embodiment, a hollow portion S surrounded by the film-shaped resin layer 40 is located between the principal surface 11 of the substrate 10 and the electronic component 20A; and the land 12, the electrode 21, and the joint material 30 which define a joint portion between the substrate 10 and the electronic component 20A are located in the hollow portion S. With the configuration, in a case in which the electronic component module 1A is further mounted on a mother board or the like and used, when reflowing is performed during mounting, an occurrence of a flashing phenomenon (a discharging phenomenon) of the joint material 30, the phenomenon which occurs because a bonding surface between a resin sealing layer and the substrate 10 is broken, is prevented.

Also, with the configuration provided with the above-described hollow portion S, an advantage that the function of the electronic component 20A is stably attained is achieved. Regarding the advantage, if an electronic element is used as the electronic component 20A, the electronic element which is represented by a surface acoustic wave element, a piezoelectric element, or a harmonic element, and which causes the function not to be attained or which causes the function to be changed because the element function unit is covered with other member, the function is attained by arranging the element function unit to face the hollow portion S.

The method of forming the resin sealing portion including the film-shaped resin layer 40 and the embedding resin layer 50 may use any of various formation methods, such as casting, potting, vacuum pressing, vacuum printing, rubber pressing, and hydrostatic-pressure pressing. For example, a resin sealing member in which a resin sheet to be the embedding resin layer 50 is bonded to a resin film to be the film-shaped resin layer 40 is prepared, the substrate 10 after the electronic component 20A is mounted is pushed into the resin sealing member so that the electronic component 20A is embedded in the resin sealing member, and the resin sealing member is hardened while maintaining the state. Thus, the above-described resin sealing portion is formed.

In the electronic component module 1A according to this preferred embodiment, the coefficient of linear expansion of the embedding resin layer 50 is adjusted to be smaller than the coefficient of linear expansion of the film-shaped resin layer 40. Accordingly, even when a thermal shock is added to the electronic component module 1A, the film-shaped resin layer having a relatively large coefficient of linear expansion absorbs and relaxes expansion and contraction of the electronic component 20A, and hence prevents, for example, breakage of the electronic component 20A and breakage of the above-described joint portion. The coefficient of linear expansion of the embedding resin layer 50 may be preferably set to be equivalent to or close to the coefficient of linear expansion of the electronic component 20A.

In addition, the electronic component module 1A according to this preferred embodiment is configured such that, when the thickness of the upper-surface cover portion 40a of the film-shaped resin layer 40 covering the upper surface 20a of the electronic component 20A is Ta, the thickness of the side-surface cover portion 40b of the film-shaped resin layer 40 covering the side surfaces 20b of the electronic component 20A is Tb, and the thickness of the substrate cover portion 40c of the film-shaped resin layer 40 covering the principal surface 11 of the substrate 10 is Tc, the thickness Tb of the side-surface cover portion 40b is smaller than either of the thickness Ta of the upper-surface cover portion 40a and the thickness Tc of the substrate cover portion 40c (that is, Tb<Ta and Tb<Tc).

With this configuration, even when the film-shaped resin layer 40 with a relatively large coefficient of linear expansion is used, since the thickness Tb of the side-surface cover portion 40b is relatively small, the embedding resin layer with a relatively small coefficient of linear expansion is located at a position relatively close to the side surfaces 20b of the electronic component 20A in a direction parallel or substantially parallel to the principal surface 11 of the substrate 10. Accordingly, the stress of the embedding resin layer 50, the stress which occurs when the temperature is changed because the electronic component module 1A is soldered to a mother board or the like, is decreased. Accordingly, the binding force of the resin sealing portion in the direction with respect to the electronic component 20A is increased. The thermal shock resistance (that is, joining reliability at the joint portion) is greatly improved. If a filler with high thermal conductivity is added to the film-shaped resin layer 40 to increase heat radiation, the upper limit of the content of the filler is limited for obtaining extensibility of the film. To address this, by decreasing the thickness of the portions of the film-shaped resin layer 40 arranged to contact the side surfaces of the electronic component 20A and the hollow portion S, the heat radiation of the portions of the film-shaped resin layer 40 located at the side surfaces of the electronic component 20A and the hollow portion S is increased as compared with the heat radiation of the portion of the film-shaped resin layer 40 located at the upper surface 20a of the electronic component 20A.

Also, in the electronic component module 1A according to this preferred embodiment, since the binding force with respect to the electronic component 20A is increased and the thermal shock resistance is ensured by relatively decreasing the thickness Tb of the side-surface cover portion 40b as described above, the resin film may be formed of a member having high viscosity, being easily extensible, and being relatively soft so that the resin film to be the film-shaped resin layer 40 closely contacts the electronic component 20A and the substrate 10. Thus, the sealing properties of the electronic component 20A and the hollow portion S with respect to the outside are ensured.

As described above, the film-shaped resin layer 40 configured such that the thickness Tb of the side-surface cover portion 40b is smaller than either of the thickness Ta of the upper-surface cover portion 40a and the thickness Tc of the substrate cover portion 40c preferably is formed by the formation method exemplarily described above. In particular, when the substrate 10 after the electronic component 20A is mounted is pushed into the resin sealing member, the portion to be the side-surface cover portion 40b extends more than the other portion and hence becomes thin. At this time, the thickness Tb of the side-surface cover portion 40b is adjusted to a desirable thickness by properly adjusting various manufacturing conditions, such as the pressure, speed, temperature, and time; material conditions, such as viscosity and curing rate, of the resin sealing member; and dimensional conditions of respective portions in the electronic component module to be manufactured.

As described above, by including the configuration according to this preferred embodiment, both the sealing properties and the thermal shock resistance are ensured, and hence an electronic component module with high reliability is provided.

Second Preferred Embodiment

Figure 2:
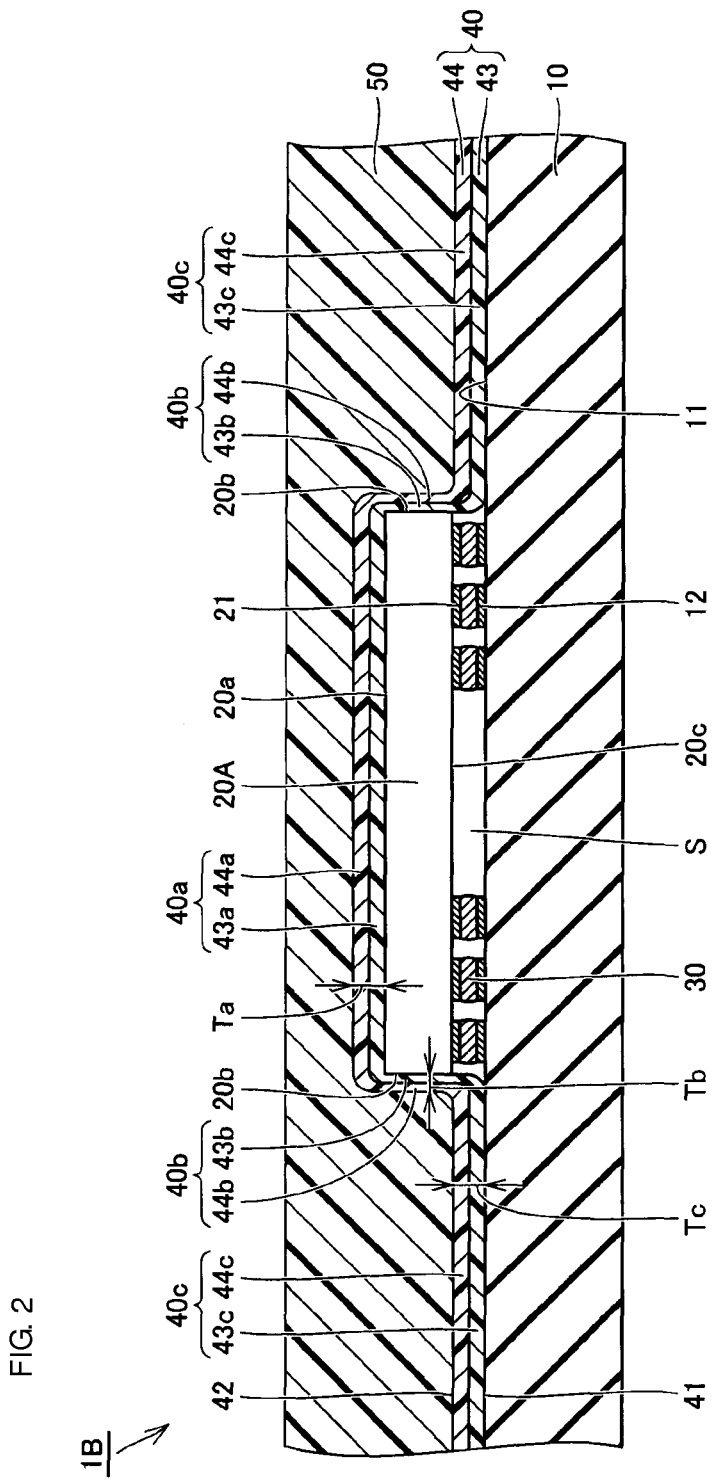
FIG. 2 is a schematic cross-sectional view of an electronic component module according to a second preferred embodiment of the present invention.

FIG. 2 is a schematic cross-sectional view of an electronic component module according to a second preferred embodiment of the present invention. An electronic component module 1B according to this preferred embodiment is described below with reference to FIG. 2.

As shown in FIG. 2, the electronic component module 1B according to this preferred embodiment differs from the electronic component module 1A according to the first preferred embodiment in that a film-shaped resin layer 40 defining a resin sealing portion includes a multilayer body of a plurality of resin films, and hence the film-shaped resin layer 40 includes a first film-shaped resin layer 43 and a second film-shaped resin layer 44.

To be specific, the first film-shaped resin layer 43 is located closer to the substrate 10 and the electronic component 20A than the second film-shaped resin layer 44, and includes an upper-surface cover portion 43a and a side-surface cover portion 43b that cover the upper surface 20a and the side surfaces 20b of the electronic component 20A, and a substrate cover portion 43c that covers the principal surface 11 of the substrate 10. The second film-shaped resin layer 44 is located closer to the embedding resin layer 50 than the first film-shaped resin layer 43, and includes an upper-surface cover portion 44a, a side-surface cover portion 44b, and a substrate cover portion 44c that cover the upper-surface cover portion 43a, the side-surface cover portion 43b, and the substrate cover portion 43c of the first film-shaped resin layer 43.

Accordingly, in the electronic component module 1B according to this preferred embodiment, the upper-surface cover portion 43a of the first film-shaped resin layer 43 and the upper-surface cover portion 44a of the second film-shaped resin layer 44 define an upper-surface cover portion 40a of the film-shaped resin layer 40; the side-surface cover portion 43b of the first film-shaped resin layer 43 and the side-surface cover portion 44b of the second film-shaped resin layer 44 define a side-surface cover portion 40b of the film-shaped resin layer 40; and the substrate cover portion 43c of the first film-shaped resin layer 43 and the substrate cover portion 44c of the second film-shaped resin layer 44 define a substrate cover portion 40c of the film-shaped resin layer 40.

In the electronic component module 1B according to this preferred embodiment, the coefficient of linear expansion of the embedding resin layer 50 is adjusted to be smaller than the coefficient of linear expansion of any layer of the film-shaped resin layer 40 including the multilayer body (that is, the first film-shaped resin layer 43 and the second film-shaped resin layer 44); the total thickness Tb of the side-surface cover portion 40b of the film-shaped resin layer 40 including the multilayer body (that is, the sum of the thickness of the side-surface cover portion 43b of the first film-shaped resin layer 43 and the thickness of the side-surface cover portion 44b of the second film-shaped resin layer 44) is smaller than any of the total thickness Ta of the upper-surface cover portion 40a of the film-shaped resin layer 40 including the multilayer body (that is, the sum of the thickness of the upper-surface cover portion 43a of the first film-shaped resin layer 43 and the thickness of the upper-surface cover portion 44a of the second film-shaped resin layer 44) and the total thickness Tc of the substrate cover portion 40c of the film-shaped resin layer 40 including the multilayer body (that is, the sum of the thickness of the substrate cover portion 43c of the first film-shaped resin layer 43 and the thickness of the substrate cover portion 44c of the second film-shaped resin layer 44) (that is, Tb<Ta, and Tb<Tc).

Hence, with this configuration, the advantages described in the above-described first preferred embodiment are achieved. Both the sealing properties and the thermal shock resistance are ensured, and hence an electronic component module with high reliability is provided.

In this preferred embodiment, the example has been described in which the film-shaped resin layer that defines the resin sealing portion includes the multilayer body including the two-layer resin film, for example. However, the film-shaped resin layer may include a multilayer body including three or more layers. However, even in this case, the total thickness Tb of the side-surface cover portion of the film-shaped resin layer including the multilayer body preferably is smaller than any of the total thickness Ta of the upper-surface cover portion of the film-shaped resin layer including the multilayer body and the total thickness Tc of the substrate cover portion of the film-shaped resin layer including the multilayer body.

Third Preferred Embodiment

Figure 3:
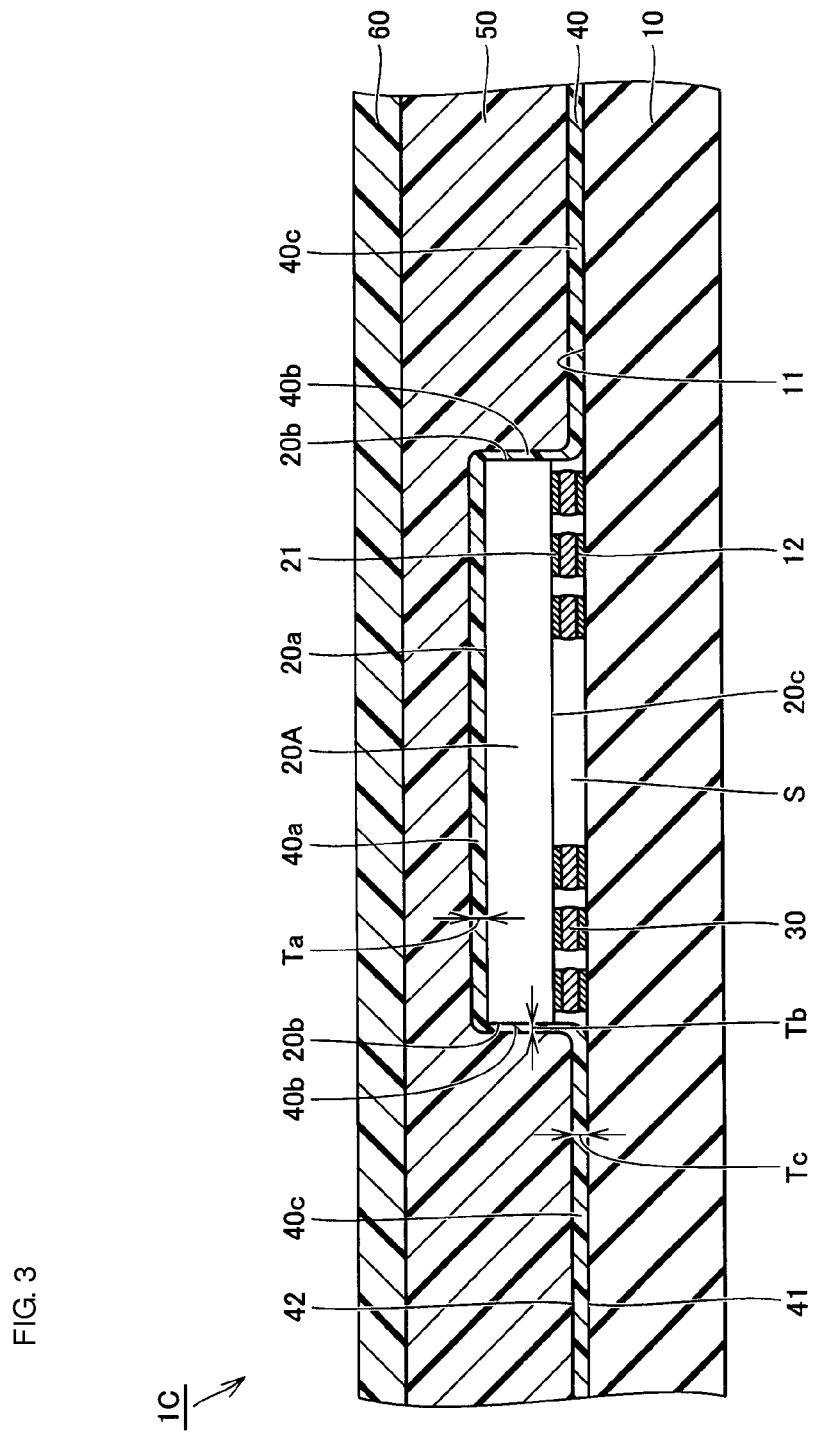
FIG. 3 is a schematic cross-sectional view of an electronic component module according to a third preferred embodiment of the present invention.

FIG. 3 is a schematic cross-sectional view of an electronic component module according to a third preferred embodiment of the present invention. An electronic component module 1C according to this preferred embodiment is described below with reference to FIG. 3.

As shown in FIG. 3, the electronic component module 1C according to this preferred embodiment differs from the electronic component module 1A according to the above-described first preferred embodiment in that the electronic component module 1C according to this preferred embodiment further includes a protecting resin layer 60 to cover the embedding resin layer 50 defining the resin sealing portion.

To be specific, in the electronic component module 1C according to this preferred embodiment, the protecting resin layer 60 is located at a side opposite to the substrate 10 when viewed from the embedding resin layer 50. The protecting resin layer 60 covers the entire surface of the embedding resin layer 50. The protecting resin layer 60 is configured to protect the upper surface of the electronic component module 1C, and is configured to have recorded therein various information, such as the item number and lot number, inscribed by irradiation with laser light.

The material of the protecting resin layer 60 is not particularly limited. However, if the protecting resin layer 60 is formed of resin containing a filler by a large amount, recognizability is decreased when the above-described information inscribed with the laser light is read. Hence, to improve the recognizability, resin containing a filler by a smaller amount than that of the embedding resin layer 50 may be preferably used.

Also, the thickness of the protecting resin layer 60 may be preferably smaller than the minimum thickness of the embedding resin layer 50 in a direction perpendicular or substantially perpendicular to the principal surface 11 of the substrate 10. With this configuration, occurrence of a stress which may be possibly applied to the embedding resin layer 50 as the result of the difference between the coefficient of linear expansion of the protecting resin layer 60 and the coefficient of linear expansion of the embedding resin layer 50 is significantly decreased or prevented.

Also in the electronic component module 1C according to this preferred embodiment, the coefficient of linear expansion of the embedding resin layer 50 is adjusted to be smaller than the coefficient of linear expansion of the film-shaped resin layer 40, and the film-shaped resin layer 40 is configured so that the thickness Tb of the side-surface cover portion 40b is smaller than either of the thickness Ta of the upper-surface cover portion 40a and the thickness Tc of the substrate cover portion 40c.

Hence, with this configuration, the advantages described in the above-described first preferred embodiment are achieved. Both the sealing properties and the thermal shock resistance are ensured, and hence an electronic component module with high reliability is provided.

Fourth Preferred Embodiment

Figure 4:
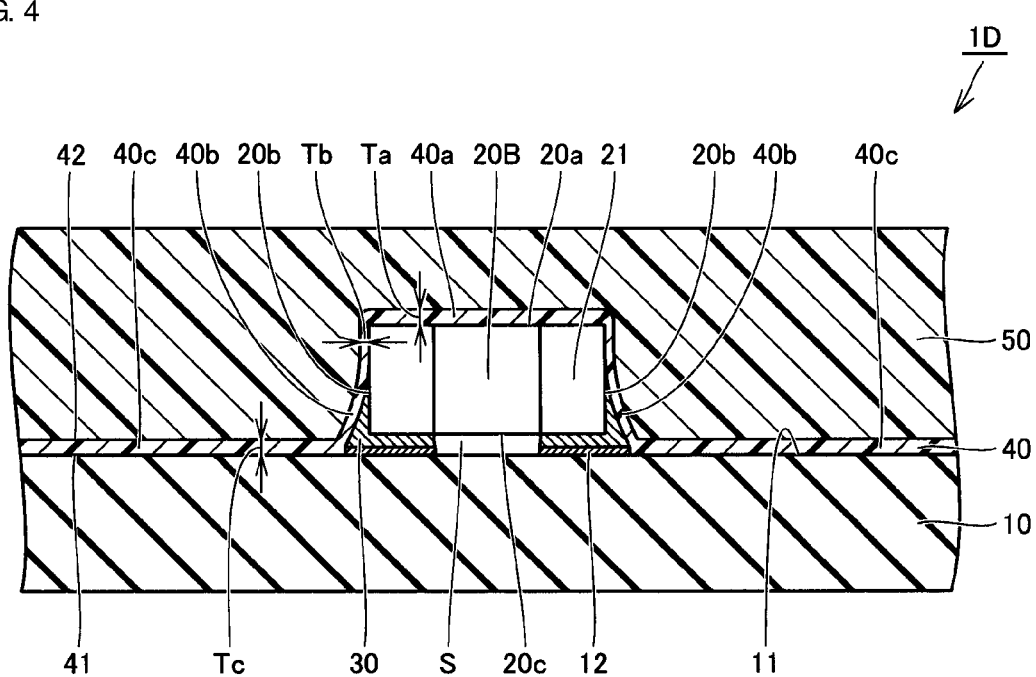
FIG. 4 is a schematic cross-sectional view of an electronic component module according to a fourth preferred embodiment of the present invention.

FIG. 4 is a schematic cross-sectional view of an electronic component module according to a fourth preferred embodiment of the present invention. An electronic component module 1D according to this preferred embodiment is described below with reference to FIG. 4.

As shown in FIG. 4, the electronic component module 1D according to this preferred embodiment differs from the electronic component module 1A according to the first preferred embodiment in that an electronic component 20B mounted on the substrate 10 is a capacitor element.

As illustrated, the capacitor element preferably has a rectangular or substantially rectangular-parallelepiped outside shape. A pair of electrodes 21 is provided to cover a portion near one end and a portion near the other end in the longitudinal direction of the outside shape. The capacitor element is mounted on the principal surface 11 of the substrate so that the pair of electrodes 21 is parallel or substantially parallel to the principal surface 11 of the substrate 10. In this case, the joint material 30 is bonded to portions of the electrodes 21 covering a lower surface 20c of the capacitor element, and also partly bulged and bonded to portions of the electrodes 21 covering the side surfaces 20b of the capacitor element.

In the electronic component module 1D according to this preferred embodiment, the coefficient of linear expansion of the embedding resin layer 50 is adjusted to be smaller than the coefficient of linear expansion of the film-shaped resin layer 40, and the film-shaped resin layer 40 is configured such that the thickness Tb of the side-surface cover portion 40b that is a portion covering side surfaces 20b of the electronic component 20B is smaller than any of the thickness Ta of the upper-surface cover portion 40a that is a portion covering an upper surface 20a of the electronic component 20B and the thickness Tc of the substrate cover portion 40c that is a portion covering the principal surface 11 of the substrate 10.

Hence, also with this configuration, the advantages described in the above-described first preferred embodiment are achieved. Both the sealing properties and the thermal shock resistance are ensured, and hence an electronic component module with high reliability is provided.

The characteristic configurations described in the above-described first to fourth preferred embodiments of the present invention may be combined as long as the configuration is not departing from the idea of the present invention.

Verification Test

Various verification tests executed for ensuring the advantages of preferred embodiments of the present invention are described. A first verification test described below simulates how a strain added to a joint portion is changed when the thickness of the upper-surface cover portion, the thickness of the side-surface cover portion, and the thickness of the substrate cover portion of the film-shaped resin layer are independently decreased. A second verification test is that the electronic component module according to the first preferred embodiment of the present invention is actually prototyped, and is applied to a thermal shock test.

First Verification Test

The first verification test applied FEM (finite element method) analysis and calculated how a strain (cumulative equivalent inelastic strain) added to a joint portion is changed when the thickness Ta of the upper-surface cover portion, the thickness Tb of the side-surface cover portion, and the thickness Tc of the substrate cover portion of the film-shaped resin layer are independently decreased in the model simplified as shown in FIG. 1.

In a first verification example, the thickness Tb of the side-surface cover portion and the thickness Tc of the substrate cover portion were constantly at 50 μm, and only the thickness Ta of the upper-surface cover portion was gradually decreased in order from 50 μm, 30 μm, and 10 μm.

In a second verification example, the thickness Ta of the upper-surface cover portion and the thickness Tc of the substrate cover portion were constantly at 50 μm, and only the thickness Tb of the side-surface cover portion was gradually decreased in order from 50 μm, 30 μm, and 10 μm.

In a third verification example, the thickness Ta of the upper-surface cover portion and the thickness Tb of the side-surface cover portion were constantly at 50 μm, and only the thickness Tc of the substrate cover portion was gradually decreased in order from 50 μm, 30 μm, and 10 μm.

In the first to third verification examples, the conditions were equivalent except that the thicknesses at the predetermined positions of the above-described film-shaped resin layer were different.

Figure 5:
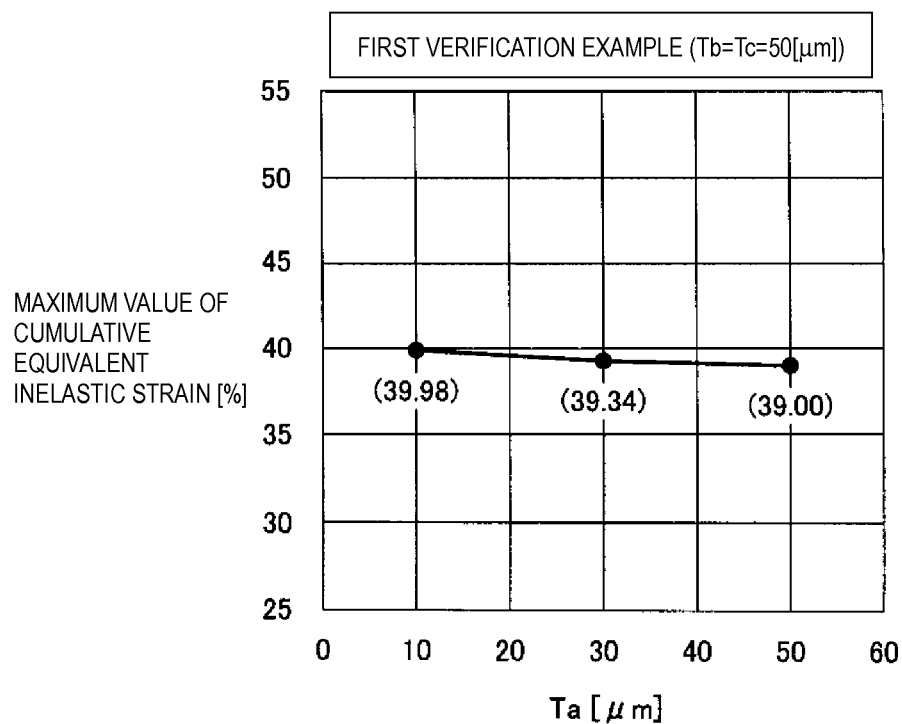
FIG. 5 is a graph showing the simulation result according to a first verification example of a first verification test.
Figure 6:
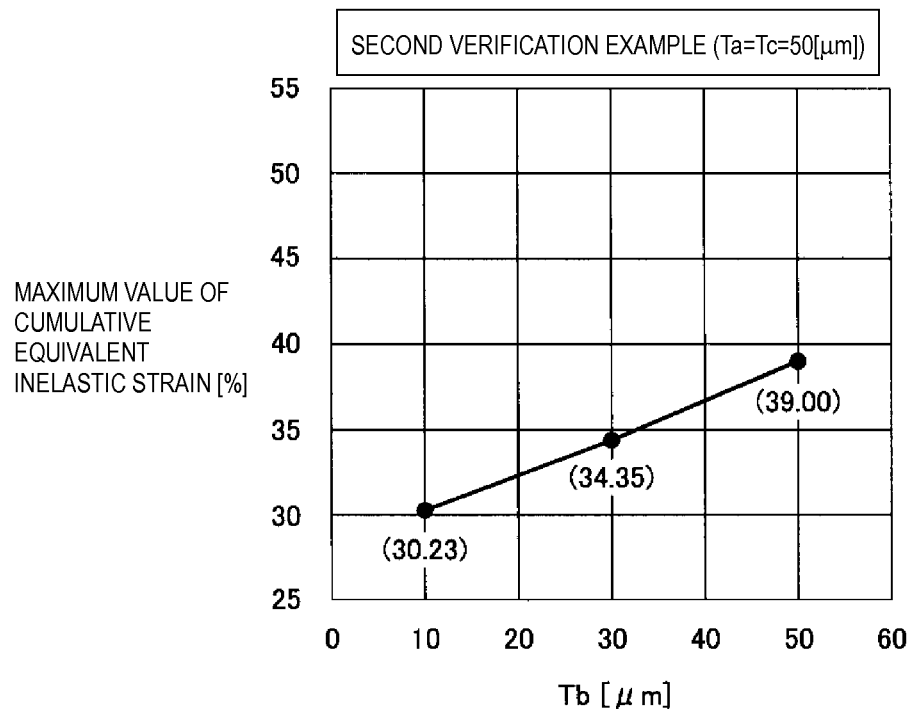
FIG. 6 is a graph showing the simulation result according to a second verification example of the first verification test.
Figure 7:
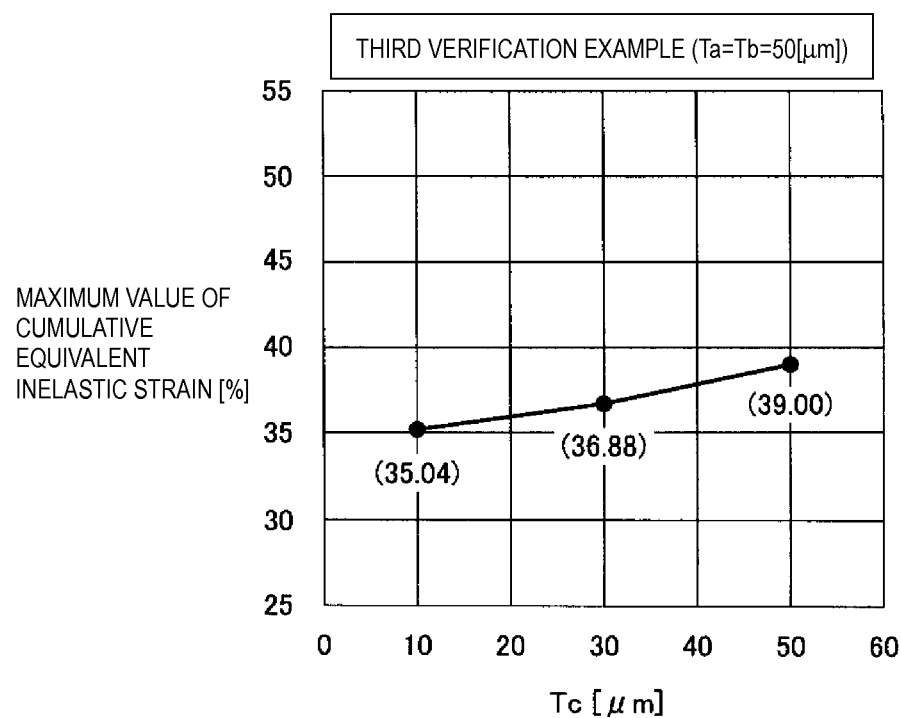
FIG. 7 is a graph showing the simulation result according to a third verification example of the first verification test.

FIGS. 5 to 7 are graphs showing the simulation results according to the first to third verification examples of the first verification test.

As shown in FIG. 5, with regard to the simulation result according to the first verification example, when only the thickness Ta of the upper-surface cover portion of the film-shaped resin layer was gradually decreased, it was ensured that the strain added to the joint portion was almost not changed.

As shown in FIG. 6, with regard to the simulation result according to the second verification example, when only the thickness Tb of the side-surface cover portion of the film-shaped resin layer was gradually decreased, it was ensured that the strain added to the joint portion was effectively decreased.

Also, as shown in FIG. 7, with regard to the simulation result according to the third verification example, when only the thickness Tc of the substrate cover portion of the film-shaped resin layer was gradually decreased, it was ensured that the strain added to the joint portion was effectively decreased, although the decrease was smaller than the case in which only the thickness Tb of the side-surface cover portion of the film-shaped resin layer was gradually decreased.

Regarding the simulation results according to the above-described first to third verification examples, it was confirmed that effective improvement in thermal shock resistance (that is, joining reliability at the joint portion) is achieved if the thickness Tb of the side-surface cover portion of the film-shaped resin layer is smaller than the thickness Ta of the upper-surface cover portion and the thickness Tc of the substrate cover portion (that is, if Tb<Ta and Tb<Tc).

Second Verification Test

In the second verification test, a plurality of electronic component modules according to the first preferred embodiment were prepared by actual prototyping as Example, and the electronic component modules were applied to a thermal shock test (temperature cycling test). In any of the above-described electronic component modules according to Example, the thickness Ta of the upper-surface cover portion and the thickness Tc of the substrate cover portion of the film-shaped resin layer were 50 µm, and the thickness Tb of the side-surface cover portion of the film-shaped resin layer was 30 µm.

Also, for comparison, as Comparative Example 1, a plurality of electronic component modules were prepared by actual prototyping, the electronic components each having the thickness Ta of the upper-surface over portion, the thickness Tb of the side-surface cover portion, and the thickness Tc of the substrate cover portion of the film-shaped resin layer being 80 µm. Also, as Comparative Example 2, a plurality of electronic component modules were prepared by actual prototyping, the electronic components each having the thickness Ta of the upper-surface cover portion, the thickness Tb of the side-surface cover portion, and the thickness Tc of the substrate cover portion of the film-shaped resin layer being 50 µm. The electronic component modules according to Example and Comparative Examples 1 and 2 had equivalent configurations except that the thicknesses at the predetermined positions of the above-described film-shaped resin layers were different as described above.

Figure 8:
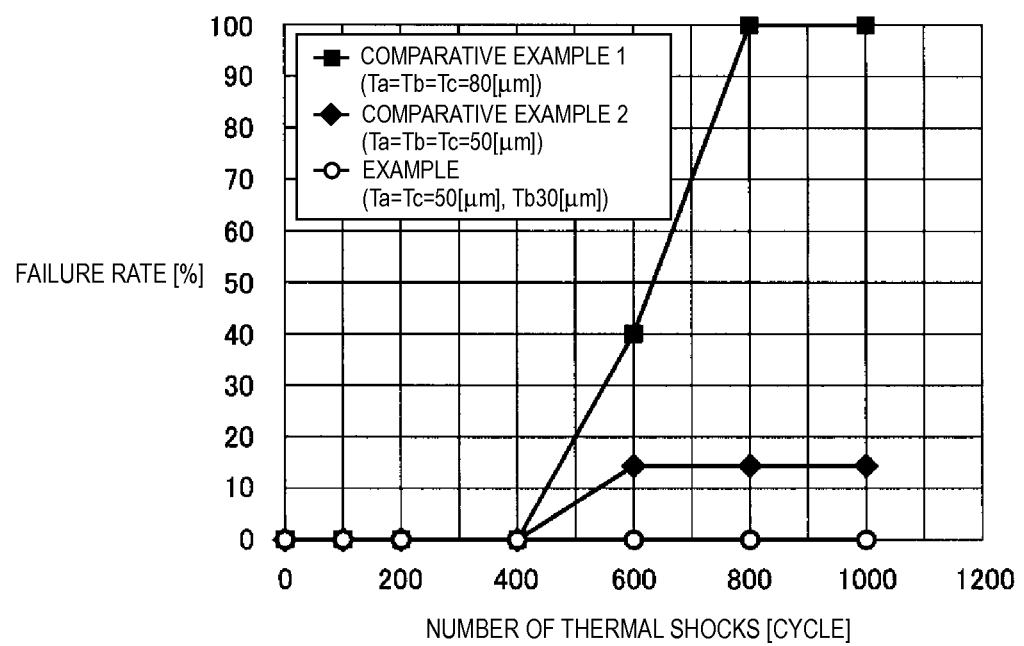
FIG. 8 is a graph showing the test result of a second verification test.

FIG. 8 is a graph showing the test result of the second verification test. As shown in FIG. 8, it was confirmed that the failure rate of the electronic component module according to Example was 0% even when reached at 1000 cycles, the failure rate of the electronic component module according to Comparative Example 1 was about 40% when reached at 600 cycles, and the failure rate of the electronic component module according to Comparative Example 2 was about 15% when reached at 600 cycles.

Regarding the test results according to the above-described second verification test, it was confirmed that effective improvement in thermal shock resistance (that is, joining reliability at the joint portion) is achieved if the thickness Tb of the side-surface cover portion of the film-shaped resin layer is smaller than the thickness Ta of the upper-surface cover portion and the thickness Tc of the substrate cover portion (that is, if Tb<Ta and Tb<Tc).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component module comprising:
    an electronic component;
    a substrate including a principal surface on which the electronic component is mounted; and
    a resin seal that seals the electronic component and covers the principal surface of the substrate; wherein
    the resin seal consists of:
        a single film-shaped resin layer covering an upper surface and side surfaces of the electronic component and covering only the principal surface of the substrate; and
        a single embedding resin layer covering a front surface of the film-shaped resin layer located at a side opposite to the substrate; wherein the embedding resin layer has a smaller coefficient of linear expansion than a coefficient of linear expansion of the film-shaped resin layer; wherein a front surface of the embedding resin layer located at a side opposite to the substrate is exposed and
        a portion of the film-shaped resin layer covering the side surfaces of the electronic component has a smaller thickness than either of a thickness of a portion of the film-shaped resin layer covering the upper surface of the electronic component and a thickness of a portion of the film-shaped resin layer covering the principal surface of the substrate.

2. The electronic component module according to claim 1, wherein
    a hollow portion is provided between the principal surface of the substrate and the lower surface of the electronic component, the hollow portion being surrounded by the film-shaped resin layer; and
    a joint portion between the substrate and the electronic component is located in the hollow portion.

3. The electronic component module according to claim 1, wherein the electronic component is provided with an electrode and the substrate is provided with a land, and the electrode and the land are joined through solder.

4. The electronic component module according to claim 1, wherein the electronic component includes one of a semiconductor element, a capacitor element, an inductor element, a resistive element, a piezoelectric element, a surface acoustic wave element, and a harmonic element.

5. The electronic component module according to claim 1, wherein a total thickness of a side-surface cover portion of the film-shaped resin layer is smaller than a total thickness of an upper-surface cover portion of the film-shaped resin layer and a total thickness of a substrate cover portion of the film-shaped resin layer.

6. The electronic component module according to claim 1, further comprising a protecting resin layer that covers at least a portion of the embedding resin layer.

7. The electronic component module according to claim 6, wherein the protecting resin layer covers an entire surface of the embedding resin layer.

8. The electronic component module according to claim 6, wherein a thickness of the protecting resin layer is less than a minimum thickness of the embedding resin layer.

9. The electronic component module according to claim 6, wherein the electronic component is a capacitor.

* * * * *